United States Patent [19]

Van Berkel

[11] Patent Number: 5,358,809
[45] Date of Patent: Oct. 25, 1994

[54] METHODS OF FABRICATING THIN FILM STRUCTURES BY IMAGING THROUGH THE SUBSTRATE IN DIFFERENT DIRECTIONS

[75] Inventor: Cornelis Van Berkel, Brighton, England

[73] Assignee: U.S. Philips Corporation, New York, N.Y.

[21] Appl. No.: 19,530

[22] Filed: Feb. 19, 1993

[30] Foreign Application Priority Data

Feb. 20, 1992 [GB] United Kingdom ............. 9203595.5

[51] Int. Cl.$^5$ ............................................. G03F 9/00
[52] U.S. Cl. ............................................. 430/6; 430/5; 430/312; 430/322
[58] Field of Search ............. 430/5, 6, 7, 321, 322, 430/4, 20, 325, 312

[56] References Cited

U.S. PATENT DOCUMENTS

| | | | |
|---|---|---|---|
| 4,683,183 | 7/1987 | Ono | 430/20 |
| 4,820,612 | 4/1989 | Mose et al. | 430/321 |
| 5,169,737 | 12/1992 | Haws | 430/321 |

FOREIGN PATENT DOCUMENTS

62-132367 6/1987 Japan.
62-160768 7/1987 Japan.

*Primary Examiner*—Steve Rosasco
*Attorney, Agent, or Firm*—Steven R. Biren

[57] ABSTRACT

A method of fabricating thin film structures on the surface of a transparent substrate (10) in which a light shielding pattern (20, 54) is provided adjacent the opposing substrate surface and in which deposited thin film layers are photolithographically patterned by directing radiation onto the light shielding pattern and by varying the angle of the exposing radiation for respective layers whereby the thin film layers are patterned differently while using the same light shielding pattern. Various thin film structures can be fabricated inexpensively and reliably using this approach together with standard processing techniques such as the use of temporary layers and lift-off procedures. In particular, by appropriate design of the light shielding pattern and selection of deposited materials, active matrix arrays, e.g. comprising MIMs or TFTs with associated conductors, for use in liquid crystal display devices can be produced. The light shielding pattern can be formed directly on the substrate enabling pliable substrates to be used.

16 Claims, 5 Drawing Sheets

METHODS OF FABRICATING THIN FILM STRUCTURES BY IMAGING THROUGH THE SUBSTRATE IN DIFFERENT DIRECTIONS

BACKGROUND OF THE INVENTION

This invention relates to a method of fabricating on one surface of a transparent substrate a thin film structure comprising a plurality of thin film layers in predetermined patterns, which method comprises the steps of providing a light shielding pattern adjacent the opposing surface of the substrate and photolithographically patterning a first thin film layer deposited over the one surface according to the light shielding pattern using radiation directed onto the light shielding pattern.

The invention relates also to thin film structures fabricated thereby and display devices incorporating such structures.

Thin film structures fabricated on transparent substrates are used in a variety of products such as display devices, solar cells, light sensing devices, memory devices, and printing devices. The invention is concerned with fabricating thin film structures suitable for such products and particularly, although not exclusively, with fabricating arrays of thin film switching elements for use in active matrix display devices, together with associated address conductors and picture element electrodes. Typically, the thin film switching elements comprise two or three terminal devices such as MIM devices and TFTs respectively which are connected between address conductors and picture element electrodes on a common transparent substrate.

A method of the kind described in the opening paragraph for fabricating thin film MIM devices on a transparent substrate for use in an active matrix liquid crystal display device is disclosed in U.S. Pat. No. 4,683,183. In this method, metal strips constituting a set of address conductors are defined on the substrate using a mask. Thereafter successive layers of insulating and conducting materials are deposited over the substrate surface and these layers are patterned by means of a photolithographic process which involves depositing a photoresist layer over the layers to be defined, applying a photomask to the rear surface of the substrate and illuminating the substrate from behind whereby the pattern of the superimposed insulating and conducting layers obtained is determined in part using a self alignment technique in which the metal strips serve as a mask to define a MIM structure and also in part by the photomask to define the length of the MIM structure and the area of the picture element electrode. Thus, the fabrication of the MIM device and its associated picture element electrodes entails using a mask to define the metal strips, those strips then themselves being used as a mask, and also a photomask.

In the English language abstract of Japanese Patent Application No. 62-132367 there is disclosed a method of fabricating TFTs on a transparent substrate for use in a liquid crystal display device which involves disposing a light shielding film layer on the rear surface of the substrate and photolithographically patterning a layer deposited on the upper surface by illuminating the substrate from behind with the light shielding film serving as a mask defining regions of the deposited layer which constitute source and drain terminals of the TFT. Further layers are then deposited which would require additional patterning processes using further masks to complete the TFT.

In requiring a plurality of patterning processes involving separate masks, these known methods suffer from disadvantages similar to those experienced with more common methods of fabricating of TFTs or MIMs for display devices or the like entailing a series of conventional photolithographic processes needing a set of several photo masks to define patterns in layers of different materials. To increase the display area of a display device, for example, it is necessary to produce correspondingly sized arrays of TFTs or MIMs. However, as the size of the array is enlarged it becomes increasingly more difficult and more expensive to provide substrates that remain sufficiently rigid through the thermal cycles in the fabrication processes to ensure accurate alignment between successive photomasks and the substrate. A similar problem exists when fabricating smaller sized but higher density arrays. Of course, such known methods are not well suited to fabricating thin film structures on flexible substrates.

SUMMARY OF THE INVENTION

It is an object of the present invention to provide a method of fabricating thin film structures on a transparent substrate which can be employed to alleviate the aforementioned problem at least to some extent.

It is another object of the present invention to provide a method of fabricating thin film structures, such as switching element arrays, on a transparent substrate which requires a minimal number of masks.

It is a further object of the present invention to provide thin film structures such as switching element arrays together with address conductors and electrodes on a transparent substrate suitable for use in active matrix display devices in a convenient and inexpensive manner.

According to one aspect of the present invention a method of the kind described in the opening paragraph is characterized by the step of patterning photolithographically a second thin film layer deposited over the one surface of the substrate using radiation directed onto the light shielding pattern in a direction with respect to the substrate different to that used for patterning said first thin film layer.

The invention involves the recognition that different layer patterns can be created by using one light shielding pattern, serving as a mask, and changing the direction of illumination when defining the different layers. It will be appreciated that as a result of using different directions between the exposure beam and the substrate the pattern obtained in the two thin film layers, while both being dependent on the light shielding pattern, will be different to one another. Consequently, two thin film layers can be defined into respective patterns using the same light shielding pattern, rather than using two separate masks. The difference in patterns obtained in a simple case can be in the form of an offset between the defined regions of the two layers, the extent of offset being dependent on the difference in illumination directions and the distance between the light shielding pattern and the resist layer used in the photolithographic patterning process. In the case of the second layer being deposited and patterned after patterning of the one layer then, depending on the material used for the one layer and its transparency to the radiation, the patterned one layer may also play a part in the patterning of the second layer.

This method can be used to considerable advantage in simplifying the fabrication of thin film structures.

A third thin film layer may be deposited over the one surface of the substrate and patterned photolithographically using radiation directed onto the light shielding pattern in a direction different to that used in the photolithographical patterning of said first, and/or second thin film layers. The pattern of the third layer will then be different to at least one of the other layers, and may in addition also be dependent on the pattern of the underlying layer(s).

A further one or more thin film layers may be deposited successively with one of said first, second or third layers and photolithographically patterned simultaneously with that layer. In this way, two or more layers of different materials are patterned substantially identically and a pattern of the combined, and superimposed, layers is formed on the substrate.

One or more of the deposited thin film layers may be patterned using radiation directed onto the light shielding pattern from more than one direction. This enables further differences in the patterning of an individual layer or layers to be obtained. The one or more layers preferably are patterned using radiation in two substantially opposing directions which lie in a plane substantially perpendicularly of the one surface of the substrate. By suitably choosing these substantially opposing directions with respect to radiation opaque parts of the light shielding pattern which have comparatively small dimensions in relation to those directions, for example narrow strip regions, the definition of parts in the thus patterned layer corresponding therewith can be selectively excluded.

As a further enhancement in fabricating thin film structures, a temporary thin film layer pattern may be provided over the substrate surface by depositing a thin film layer and patterning the layer photolithographically using radiation directed onto the light shielding pattern, which temporary layer pattern is subsequently removed following the deposition of one of said thin film layers, for example by selecting etching, so as to lift off immediately overlying regions of that one thin film layer. In this way still further different layer patterns can be produced.

The term light shielding pattern used herein is intended to mean a pattern which is opaque to the exposing radiation which preferably is U-V light, although visible light and possibly x-rays may be used, and the term should be construed accordingly.

The above techniques conveniently enable two or more thin film layers to be patterned separately using just one light shielding pattern and consequently they avoid the kind of problems experienced in known processes which use a plurality of separate masks, and in particular those problems associated with the need for accurately aligning each mask. The techniques offer the advantage that by appropriate selective utilisation of one or more of them various thin film structures can be fabricated in a simple manner reliably and inexpensively by reducing the number of masks entailed compared with known processes for producing similar structures. In particular and desirable embodiments of the method of the present invention, then by suitably selecting the light shielding pattern, the materials of the deposited layers, and the radiation exposure directions used in photolithographically patterning of the deposited layers, an array of MIMs or TFTs together with associated address conductors and pad electrodes can be fabricated on a transparent substrate suitable for use for example in active matrix liquid crystal display devices or other products such as memory devices. The method requires in effect just one mask, constituted by the light shielding pattern, compared with the multiplicity of masks normally demanded. Problems with registration and the need for accurate alignment necessary in known multiple mask, multiple exposure fabrication processes used for such structures are thus avoided. Comparatively large, or high density, arrays can be achieved without the need to use very sophisticated photolithographic equipment.

The light shielding pattern may be arranged adjacent, but spaced from, the opposing surface of the substrate. Preferably, however, the light shielding pattern is carried on the opposing surface. Preferably, the light shielding pattern comprises a thin film pattern of radiation opaque material, for example, metal, formed on the opposing surface which pattern can readily be obtained by photolithographically defining a deposited layer using a master mask. Relative movement between the light shielding pattern and substrate is then prevented. As the light shielding pattern and the substrate can move together as one the need for high substrate rigidity is removed and greater freedom is allowed in the choice of substrate material. Because the light shielding pattern is fixed to the substrate, and can bend and stretch with the substrate, problems due to the effects of thermal cycling in the fabrication operations, for example distortions in glass substrates, are avoided. Importantly, pliable substrates, such as flexible foils, can be used as well as rigid glass substrates.

According to another aspect of the present invention, there is provided a thin film structure fabricated in accordance with the one aspect of the invention.

According to a further aspect of the present invention there is provided a liquid crystal display device comprising a thin film structure on a transparent substrate, including for example an array of two terminal non-linear devices or TFTs, fabricated in accordance with the one aspect of the invention.

BRIEF DESCRIPTION OF THE DRAWING

Methods of fabricating thin film structures on transparent substrates, and particularly arrays of MIMs and TFTs suitable for use in active matrix display devices, and thin film structures and display devices produced thereby, in accordance with the present invention will now be described, by way of example, with reference to the accompanying drawings, in which.

It should be understood that the Figures are merely schematic and are not drawn to scale. In particular certain dimensions such as the thickness of layers or regions may have been exaggerated whilst other dimensions may have been reduced. It should also be understood that the same reference numerals are used throughout the Figures to indicate the same or similar parts.

DESCRIPTION OF THE PREFERRED EMBODIMENTS

Figure 1A:
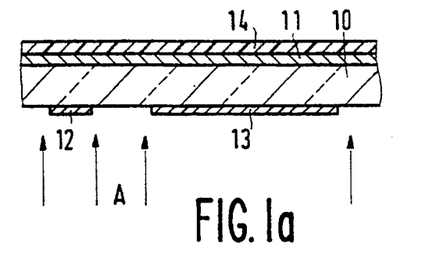
FIG. 1a, 1b, 2a and 2b, and 3a and 3b schematically illustrate respectively three different patterning techniques employed in embodiments of the invention.
Figure 1B:
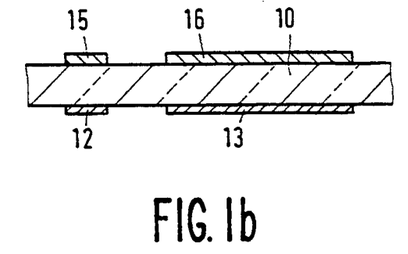
Figure 2A:
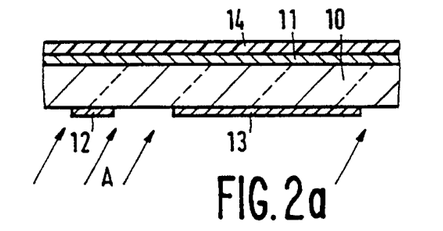
Figure 2B:
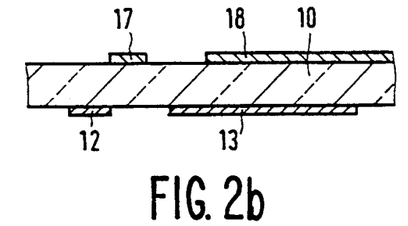
Figure 3A:
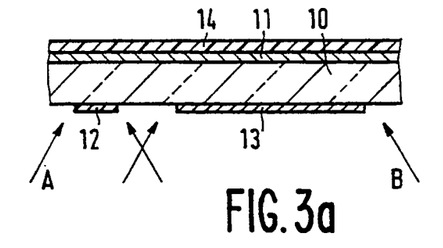
Figure 3B:
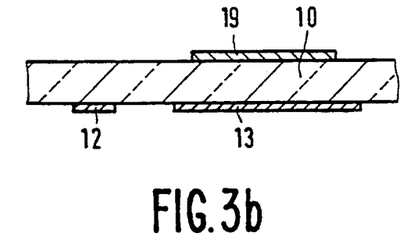
Figure 4:
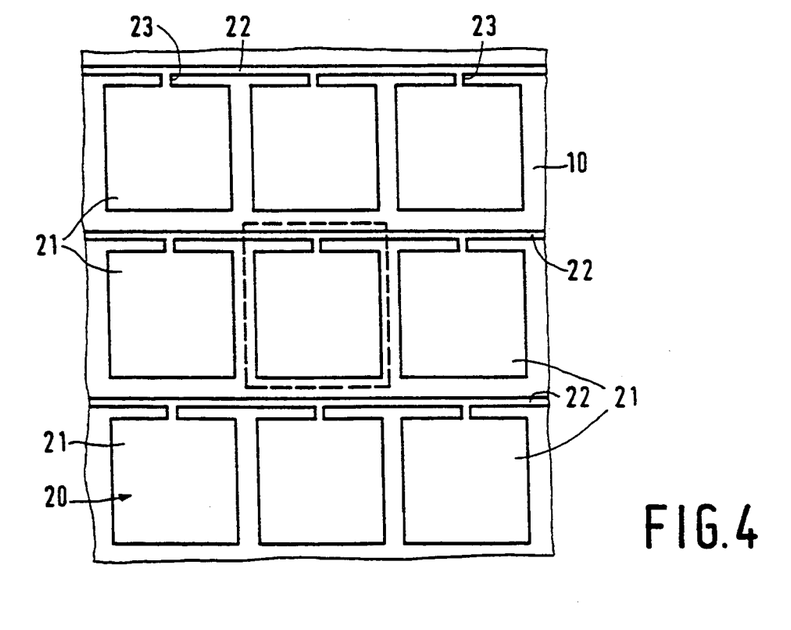
FIG. 4 is a plan view of part of the rear surface of a substrate showing a light shielding pattern formed thereon for use in a first method of fabricating thin film substrates according to the invention.
Figure 5A:
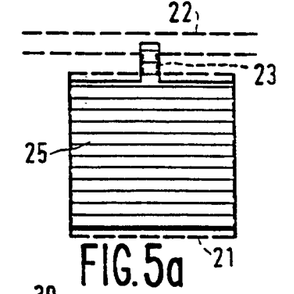
FIGS. 5a to 5e are plan views of part of the front surface of the substrate showing layer patterns at various stages in this first method.
Figure 5B:
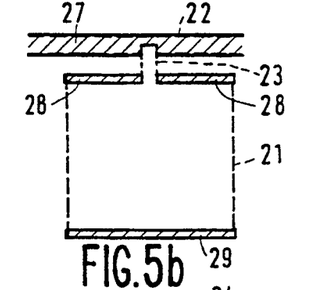
Figure 5C:
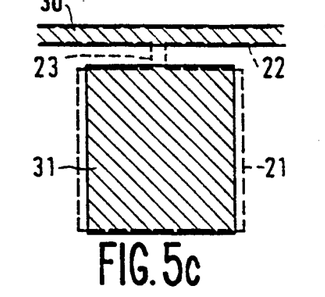
Figure 5D:
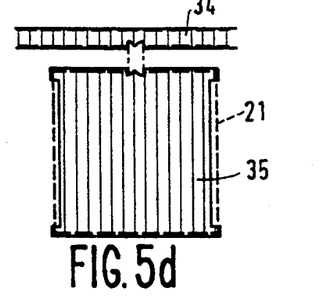
Figure 5E:
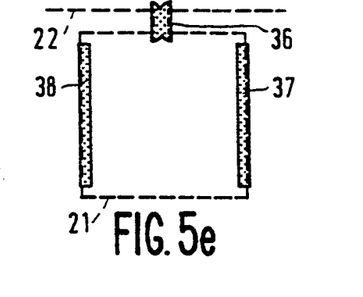

FIGS. 1 to 3 illustrate in simple manner three basic layer patterning techniques for producing respective, different patterns in a deposited layer, and ultimately desired thin film structures, in accordance with the invention. The patterning obtained in each technique is determined by an identical light shielding pattern while the layer pattern produced thereby is different in each case. These individual techniques can be employed selectively to produce layer patterns required in the fabrication of thin film structures as will be described subsequently. With regard to FIGS. 1 to 3 there is shown schematically in cross-section a portion of a suitably transparent substrate, 10, for example of glass or plastics, having opposed, parallel, planar surfaces. On the lower surface a pattern of metal or other radiation opaque material comprising comparatively narrow and wide regions 12 and 13 is provided using a conventional photolithographic process in which the material is deposited as a continuous layer over the lower surface and is then defined, by means of exposure through a mask, to leave the pattern regions 12 and 13. This metal pattern constitutes a light shielding pattern which is then used in the photolithographic patterning of layers deposited on the other, upper, surface of the substrate using radiation directed toward the substrate from the side of the substrate remote from the deposited layers.

In all photolithographic processes described hereinafter standard photoresist materials and etching agents and UV exposing radiation are utilized.

Referring to Figures 1a and 1b, a layer 11 of material to be patterned is deposited over the upper surface of the substrate 10. This layer 11 is then patterned by a photolithographic process which involves depositing thereover a layer of positive photoresist 14, and directing substantially parallel light, constituting an exposure beam perpendicularly towards the lower surface of the substrate 10, as shown by the arrows A, so as to expose regions of the photoresist layer 14 according to the light shielding pattern on the lower surface, removing exposed regions of the photoresist, etching the underlying regions of the layer 11, and thereafter removing the remaining unexposed regions of the photoresist to leave the structure as shown in FIG. 1b. This structure comprises regions 15 and 16 corresponding respectively to the regions 12 and 13. The layer pattern 15, 16 thus obtained corresponds directly to, and is registered with, the light shielding pattern.

Referring to FIGS. 2a and 2b, a layer 11 is again deposited on the upper surface of the substrate and patterned using a similar photolithographic process. However, in this case, the lower surface of the substrate 10 is illuminated with substantially parallel light, A, which is inclined with respect to that surface. Consequently, the layer pattern obtained on the upper surface, FIG. 2b, comprises regions 17 and 18 which substantially correspond to the regions 12 and 13 in terms of their size and relative disposition, but is laterally offset with respect to the light shielding pattern on the lower surface.

The technique illustrated in FIG. 3a and 3b is an extension of the above described technique. The layer 11 is again photolithographically defined but in this case the photoresist layer is subjected to two exposures involving substantially parallel light directed onto the lower surface in different directions. In the illustrated example the radiation in both exposures is slanted with respect to the substrate surface, as indicated by the arrows A and B but from opposing directions. Because of the angles of illumination at which the two exposures are performed, the layer pattern obtained differs significantly from those of the previous two techniques. In particular, with the two directions of the exposing radiation being opposed, and with individual rays in the two exposures lying and intersecting one another in a plane substantially perpendicular to the substrate surface, the dimensions of the defined regions of the deposited layer in this plane are less than the corresponding dimensions of the regions of the light shielding pattern. If a region of the light shielding pattern is of sufficiently small dimension in the relevant direction the region of resist overlying that region will be completely exposed and consequently no corresponding region in the layer pattern is produced. Thus, as shown in FIG. 3b, the layer 11 is patterned to produce a region 19 corresponding to the region 13 but with a reduced dimension in the plane of the section shown, whereas, as a result of the directions of the illumination in the two exposures with respect to the region 12, the layer pattern is devoid of any region corresponding to the region 12. In an extension of this particular technique, the patterning process may involve illumination from more than two directions.

It is seen, therefore, that with these basic techniques the same light shielding pattern can be made to image different patterns, and consequently that different layer patterns can be created as a result of changing the direction and angle of incidence of the illumination used in the exposure operation of the photolithographic processes. Further, while the above-described examples relate to a single layer deposited directly on the substrate, it will be appreciated that they can be applied to multiple thin film layer structures. It should also be understood that if successive layers are deposited over the upper surface of the substrate, these layers can be patterned, either individually or in combination, with the patterning of one or more upper layers being dependent also on the optical properties, i.e. the transmissivity, of one or more underlying layers. When successive patterning processes are performed using the same light shielding pattern each time, alignment between the resulting layer patterns is ensured.

The photolithographic definition of differing layer patterns on the surface of the substrate using a single light shielding pattern on the opposing surface and by varying the angle of illumination according to the above-described basic techniques can be used in conjunction with conventional processing and patterning techniques such as lift off and the employment of positive and negative type photoresists to fabricate various thin film structures.

Examples of the fabrication of thin film structures comprising pad electrodes connected to address conductors via switching elements and suitable for use as the active substrate component in an active matrix liquid crystal display device will now be described. FIGS. 4 to 9 illustrate various stages in one embodiment of a method of fabricating such a thin film structure according to the invention. This structure consists of an array of electrodes each of which is connected to an associated address conductor via a MIM device and constitutes the active matrix substrate of the liquid crystal display device. MIM addressed liquid crystal display devices are well known. Briefly, they comprise a row and column array of picture elements each formed by a pair of opposed electrodes carried on respective substrates with an intervening layer of liquid crystal material. One substrate carries a row and column array of individual, generally rectangular, pad electrodes constituting the picture elements' first electrodes and a first set of parallel address conductors extending therebetween. The pad electrodes of each row are connected to a respective address conductor via associated MIM devices. The other substrate carries a second set of parallel address conductors which cross the first set of address conductors and portions thereof which overlie the pad electrodes constitute the second electrodes of the picture elements.

Figure 6:
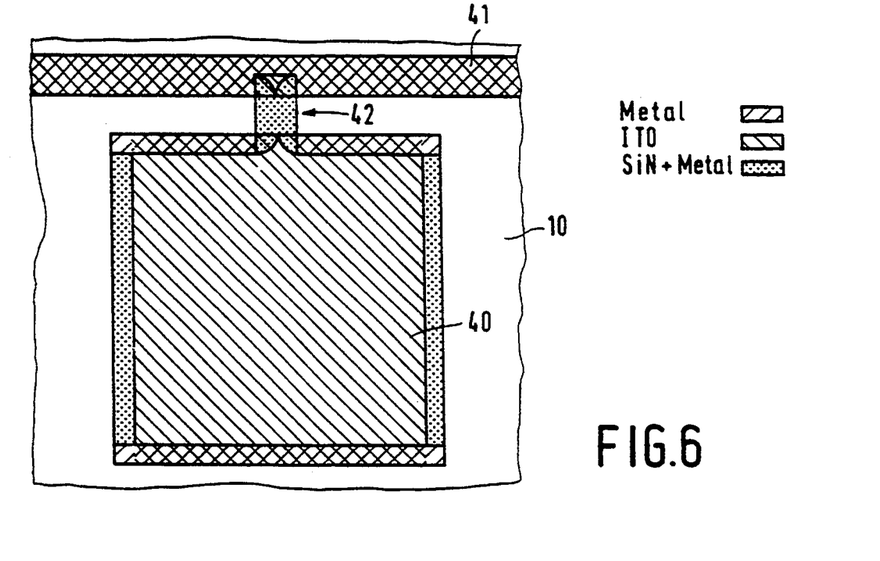
FIG. 6 is a plan view of part of the front surface of the the substrate showing a completed thin film structure fabricated by the first method.

In the fabrication of the active matrix substrate, a light shielding pattern is first formed on the lower surface of the glass substrate 10 on which the thin film structure is to be built by depositing a metal layer and defining this layer photolithographically in conventional fashion using a mask so as to leave a metal pattern. The metal pattern 20, a representative part which is shown in plan view of FIG. 4, comprises an array of rectangular areas 21, a set of lines 22 extending between adjacent rows of areas 21, and bridging portions 23 connecting each area 21 to a line 22. The parts 21, 22 and 23 serve to determine the required thin film structure as will become apparent and their dimensions are chosen accordingly. Each pad electrode, MIM device and associated portion of address conductor of the required structure is defined by a respective cell of the light shielding pattern, one such cell being indicated by the dashed lines in FIG. 4. For convenience, the fabrication of a part of the thin film structure determined by just one such cell will now be considered. FIGS. 5a to 5e illustrate plan views of the upper surface of the substrate 10 at various stages in the fabrication of the thin film structure. For the sake of clarity, these figures illustrate the formation of an individual layer pattern of interest at a particular stage and, with regard to the later stages, layer patterns defined earlier have been deliberately omitted. FIG. 6 shows in plan view the completed thin film structure.

In order to simplify the description of the illumination directions used in photolithographic processes at various stages, the directions of the compass will be used to indicate the direction of slanted radiation exposures with the top, bottom, left and right sides of the drawing sheet corresponding respectively to North (N), South (S), East (E) and West (W).

A layer of positive photoresist is deposited over the upper surface of the substrate 10 and subjected to a double exposure from the rear of the substrate 10 onto the light shielding pattern 20 using the technique of FIGS. 3a and 3b with N and S slanted radiation exposures of substantially parallel light. The resist layer is then developed with removal of exposed parts, to leave the layer pattern 25 shown by horizontal hatching in FIG. 5a. The light shielding pattern is illustrated in this Figure, and similarly in FIGS. 5b to 5e, in dashed outline for reference. As a result of this double exposure the dimension of the defined photoresist pattern 25 in a direction parallel with the N-S axis is less than that of the light shielding pattern 20 while the dimension in a direction parallel with the E-W axis is substantially the same. The difference in dimensions in the N-S direction is dependent on both the distance between the light shielding pattern and the layer of resist and the angle of slant of the exposing radiation. These parameters are appropriately selected such that, apart from at the region of the bridge portion 23, the resist material overlying the line 22 of the light shielding pattern is completely illuminated, and thus removed.

A layer of negative photoresist material is then deposited. This is exposed using substantially parallel radiation directed perpendicularly onto the rear side of the substrate 10 and then developed, according to the technique of Figures 1a and 1b. A metal layer, for example of aluminium or chromium, is evaporated over the upper surface of the substrate, following which the remaining portions of the positive and negative photoresist layers are removed, for example using acetone or fumic acid, with lift-off of the corresponding regions of the metal layer to leave regions 27, 28 and 29 of metal, as indicated by the slanted hatching in FIG. 5b, carried directly on the upper surface of the substrate 10 and determined by the light shielding pattern 20. The width of the strip regions 28 and 29 thus obtained is therefore dictated by the aforementioned illumination parameters and can be controlled accordingly.

A layer of transparent conductive material such as ITO and a layer of positive photoresist material are then deposited in succession completely over the substrate. The resulting structure is then subjected to a double exposure from the rear of the substrate 10 using substantially parallel radiation which is slanted in E and W directions respectively, again using the technique of FIGS. 3a and 3b. After developing the resist, the areas of the ITO layer which are not covered by the remaining resist material are etched away. Thereafter the remaining regions of the resist are removed to leave regions 30 and 31 of ITO material, as depicted by the slanting hatching in FIG. 5c, generally corresponding with the regions 22 and 21 of the light shielding pattern 20, it being understood that underlying regions 27, 28 and 29 of the metal layer have been omitted for clarity. As a consequence of the double exposure used to define the ITO layer, the dimension of the region 31 in the E-W direction is less than the corresponding dimension of the region 21 of the light shielding pattern 20, while the dimension of the regions 30 and 31 in the direction parallel to the N-S axis are substantially the same as those of the regions 21 and 22. The parameters selected for the E and W exposures are such that the region of the resist overlying the bridging portion 23 is completely exposed whereby the subsequently defined regions 30 and 31 of ITO are physically separate.

In the next stage, another layer of positive photoresist material is deposited over the substrate. This layer is subjected to a multiple exposure operation involving substantially parallel radiation slanted in four directions NE, SE, SW and NW, and preferably also intermediate directions. In this operation it will be understood that in addition to the light shielding pattern 20, the previously formed metal regions 27, 28 and 29 act as a further mask to the exposing radiation. Consequently, after the exposed resist has been developed, a resist pattern is obtained as shown by the vertical hatching in FIG. 5d comprising regions 34 and 35. The region 34 corresponds to the strip 22 and metal region 27 except at the region of the bridging portion 23. The region 35 corresponds to the region 21 but has a reduced dimension in the E-W direction apart from at its ends where the underlying metal regions 28 and 29 act as a mask. It is to be noted that at the area overlying the bridging portion 23 of the light shielding pattern opposing recesses are formed in the resist pattern.

A layer of negative photoresist material is deposited and subjected to exposure through the substrate with substantially parallel radiation directed perpendicularly onto the substrate surface, as in the technique of Figure 1a and 1b. This resist layer is developed and then successive thin film layers of insulating material, in this example silicon nitride, and metal, for example aluminium or chromium, are deposited. Regions of the superimposed metal and insulating layers are then removed by lift-off through removal of the positive and negative resist materials. As a result, three portions of superimposed and co-extensive insulating and metal layers are left, as indicated at 36, 37 and 38 in FIG. 5e.

The complete thin film structure thus obtained is shown in plan view in FIG. 6, the materials of different parts of the structure being denoted by hatching and dotting according to the accompanying legend and corresponding to that used in FIG. 5a–5e. The structure consists of a rectangular area 40 of ITO constituting the picture element's pad electrode whose top and bottom edges are bordered with metal strips and whose opposing sides are bordered with superimposed insulating and metal layer strips. A strip 41 comprising superimposed metal and ITO layers extends adjacent the pad electrode 40 and constitutes a portion of an address conductor which is common to all picture element pad electrodes of the same row. The pad electrode 40 is connected to the address conductor 41 via a MIM device 42 which bridges these two parts.

Figure 7:
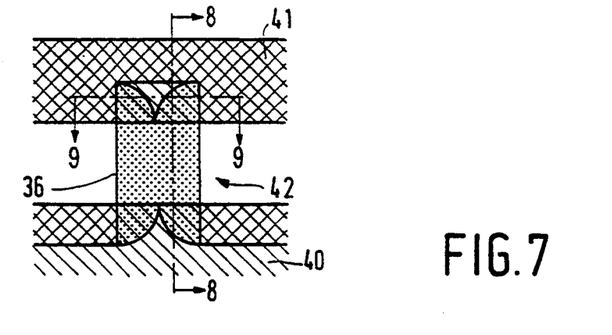
FIG. 7 is an enlarged view of part of the structure shown in FIG. 6.
Figure 8:
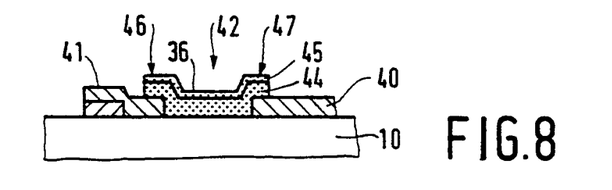
FIGS. 8 and 9 are cross-sectional views along the lines A—A and B—B respectively in FIG. 7.
Figure 9:
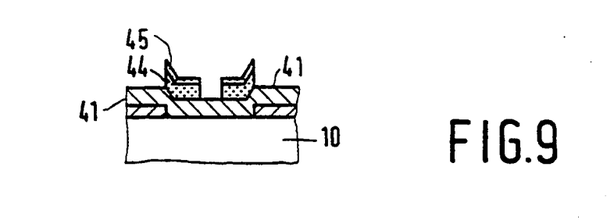

FIG. 7 is an enlarged plan view of the region of the MIM device 42 and FIGS. 8 and 9 are cross-sectional views along the lines A—A and B—B respectively of FIG. 7. The same hatching and dotting is used in FIGS. 7 to 9 as in FIG. 6. Referring particularly to FIG. 8, the MIM device 42 has a bridge portion 36 of superimposed, and co-extensive, insulating and metal layers, here referenced 44 and 45 respectively, which bridges the gap between the pad electrode 40 and the address conductor 41 with respective end parts of the bridge portion 36 overlapping edge parts of the ITO electrode 40 and the ITO conductor 41. At the overlap between each end of the bridge portion 36 and the underlying ITO layer a MIM element is created having an ITO-insulator-metal structure. These two MIM elements, referenced at 46 and 47, are connected by the metal layer of the bridge portion 36. Thus each MIM device consists of two MIM elements connected in series in a lateral configuration.

Figure 10:
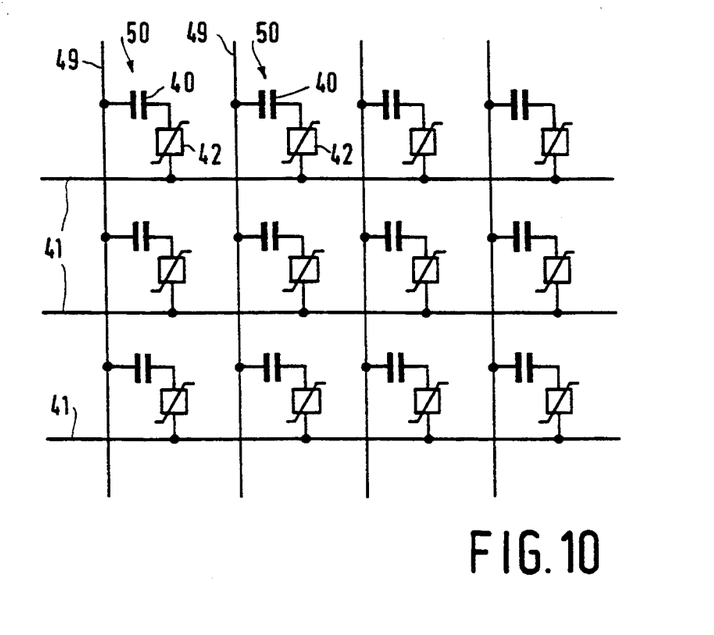
FIG. 10 illustrates the circuit configuration of a display device incorporating the thin film structure produced by this first method.

For use as an active matrix substrate component in the liquid crystal display device, the light shielding pattern 20 is removed and the thin film structure on the substrate 10 is covered by a continuous liquid crystal orientation layer in conventional manner. The component is then assembled together with a second substrate carrying the second set of parallel address conductors and liquid crystal material is disposed between the two substrates, for example as described in U.S. Pat. No. 4,683,183. The circuit configuration of the display device thus formed is shown schematically in FIG. 10 in which the second set of address conductors and the picture elements are referenced at 49 and 50 respectively. The device is driven by applying selection signals and data signals to the row and column address conductors respectively in conventional manner. By virtue of their non-linear current/voltage property the MIM devices 42 demonstrate a switching characteristic.

A second embodiment of a method of fabricating a thin film structure according to the invention will now be described. This thin film structure comprises a TFT active matrix array suitable for use in a TFT type active matrix liquid crystal display device and consists of a row and column array of pad electrodes, crossing sets of row and column address conductors and TFTs connected between each pad electrode and a respective address conductor of each set, all carried on a single transparent substrate. The circuit configuration follows conventional practice with the source, drain and gate terminals of a TFT being connected respectively to an associated column address conductor, the pad electrode and an associated row address conductor.

This method similarly employs a single light shielding pattern applied to the rear surface of the substrate and photolithographic processes involving illumination from different angles which together with lift off procedures create required individual layer patterns on the front surface of the substrate.

Figure 11:
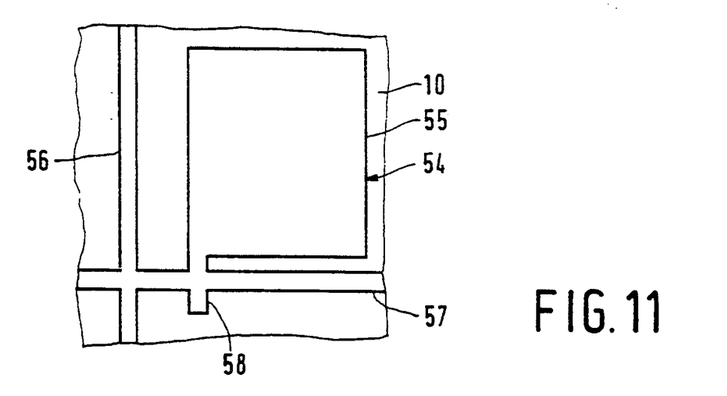
FIG. 11 is a plan view of part of the rear surface of a substrate showing a light shielding pattern formed thereon for use in a second method of fabricating thin film structures according to the invention.

A light shielding pattern, 54, is formed on the rear surface of the substrate 10 by photolithographic definition of a deposited metal layer using a mask. A part of this light shielding pattern comprising an individual, and typical, cell is shown in FIG. 11 in plan view looking through the substrate 10. The actual pattern 54 consists of a row and column array of such cells interconnected with one another, there being one cell for each of the picture elements required in the eventual active matrix array. Each cell pattern consists of a rectangular area 55 which serves to determine a pad electrode of the required thin film structure, crossing strips 56 and 57 which serve to determine portions of column and row address conductors respectively, and also part of the TFT, and an extension strip portion 58 extending from the area 54 across the strip 57 which is used to determine another part of the TFT.

Figure 12A:
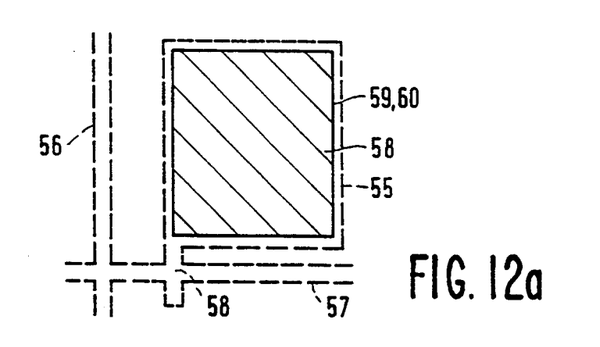
FIGS. 12a to 12c are plan views of a part of the front surface of the substrate showing layer patterns at various stages in the second method of fabricating thin film structures.
Figure 12B:
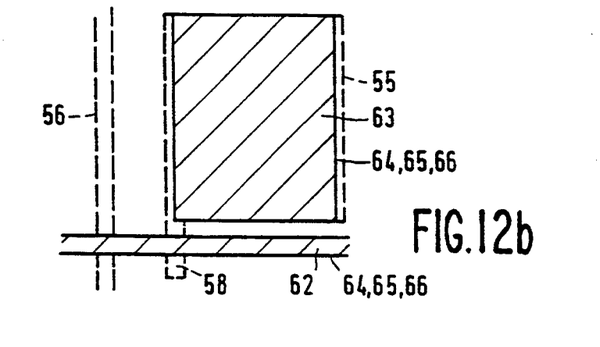
Figure 12C:
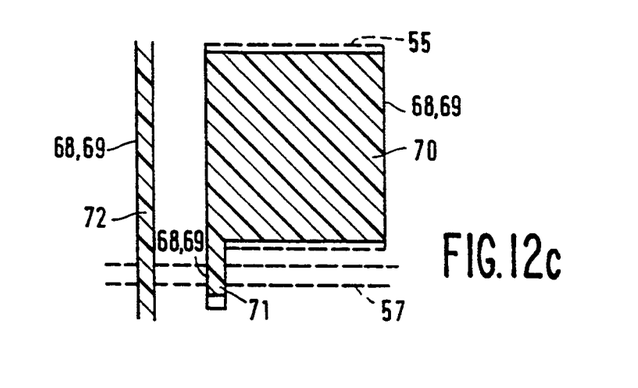

FIG. 12a, 12b and 12c are plan views of an area of the substrate corresponding to the cell pattern of FIG. 11 and illustrate various stages in the fabrication process. As in the previous example, the cell pattern is represented in dashed outline and each Figure depicts the formation of an individual layer pattern of interest at a particular stage with any previously formed layer pattern being omitted for the sake of clarity.

A layer of ITO is sputtered over the substrate surface followed by a sacrificial layer of a transparent material suitable for its intended purpose. The sacrificial layer can be of a material such as silicon nitride, silicon oxide or silicon oxynitride deposited under conditions which give it a predetermined, and comparatively fast, etching characteristic for reasons which will become apparent. Photoresist is then spun over the substrate and a multiple exposure photolithographic process is carried out in which substantially parallel radiation is directed onto the light shielding pattern with, using the same convention as before N, S, E and W slanted radiation and according to the technique of FIGS. 3a and 3b. The resist is then developed with exposed regions being removed. Exposed areas of the sacrificial and underlying ITO layers are then etched away, after which the remaining resist is removed to leave the multi-layer pattern shown by slanted hatching in FIG. 12a. This pattern consists of rectangular area 58 of superimposed and co-extensive ITO and sacrificial layers, 59 and 60 respectively, generally corresponding to the area 55 of the light shielding pattern but whose dimensions in the N/S and E/W directions are smaller as a result of the slanting exposures employed. These exposures result in the regions of resist overlying the parts 56, 57 and 58 of the light shielding pattern 54 being completely exposed to radiation, and thus the removal of the underlying regions of the sacrificial and ITO layers.

Thereafter, a second layer of ITO followed directly by successive layers of silicon nitride and amorphous silicon (a-Si:H) are deposited over the substrate. The silicon nitride is deposited under conditions which render its etching characteristics different to that of the sacrificial layer 60 when for example silicon nitride is also used for this layer. The amorphous silicon layer is sufficiently thin to be transparent to exposing radiation. Another layer of resist is spun over the substrate surface and the resulting structure subjected to a photolithographic process in which E and W slanted radiation is directed onto the rear of the substrate. After development of the resist the exposed regions of the amorphous silicon layer and the immediately underlying regions of silicon nitride and second layer of ITO are etched away. The remaining, unexposed, resist is then removed using acetone to leave the pattern shown by slanted hatching in FIG. 12b which consists of a strip region 62 and a rectangular region 63, both comprising superimposed and co-extensive layers of ITO, silicon nitride and amorphous silicon 64, 65 and 66 respectively. Opposed edges of the region 63 in the E-W direction lie inwardly of the corresponding edges of the area 55 of the light shielding pattern 54 by virtue of the exposure parameters (c.f. FIGS. 3a and 3b). It will be understood that the region 63 overlies the previously formed area 58 of superimposed ITO and sacrificial layers 59 and 60 (not shown in Figure 12b). Because of the nature of the exposures, regions of the resist overlying the regions 56 and 58 of the light shielding pattern are completely exposed and consequently corresponding regions of the layers 64, 65 and 66 are removed.

A layer of negative photoresist is then applied and subjected to exposures using N and S slanted radiation through the substrate. The existing, underlying, layer patterns are all transparent to the radiation. After developing the resist, layers of n+a-Si:H and a metal, such as aluminium or chromium, are deposited in succession. Regions of these two layers overlying the remaining regions of the resist layer are then removed by lift-off with those resist regions.

The resulting layer pattern, comprising superimposed and co-extensive layers 68 and 69 of n+a-Si:H and metal, is indicated by slanting hatching in FIG. 12c. This pattern consists of a rectangular region 70, determined by the area 55 of the light shielding pattern 54, which overlies the previously formed regions 58 and 63 and whose edges in the N-S direction lie inwardly of the corresponding edges of the area 55 and the underlying region 63 by virtue of the exposure parameters, an extension 71 determined by the extension 58 of the light shielding pattern which projects from the region 70 over the previously formed strip region 62 (not shown in FIG. 12c), and a strip region 72 which similarly crosses over the previously formed strip region 62. Because of the nature of the exposures, a region corresponding to the region 57 of the light shielding pattern is not defined.

To complete the thin film structure, the sacrificial layer 60 of the region 58 is then removed by etching, taking with it the immediately overlying areas of the second ITO layer 64, the silicon nitride layer 65 and the a-Si layer 66 of the region 63, and the immediately overlying areas of the n+a-Si:H layer 68 and the metal layer 69 of the region 70. Accordingly, the underlying area of the first ITO layer 59 of the region 58 is then exposed. To this end, the material of the sacrificial layer 60 is chosen to be selectively etchable using an etchant which does not attack the materials of any of the other layers 59, 64, 65, 66, 68 and 69, and also such that it is not attacked by any etchants or solvents used in process stages subsequent to its deposition. The deposition conditions used for the layers 60 and 65 in the case for example where silicon nitride is used for the sacrificial layer 60, are selected such that the latter layer etches away at a significantly faster rate than the layer 65 and the layer 65 is largely unaffected by this etching operation although there will be some cut-back at the edges of this layer.

Figure 13:
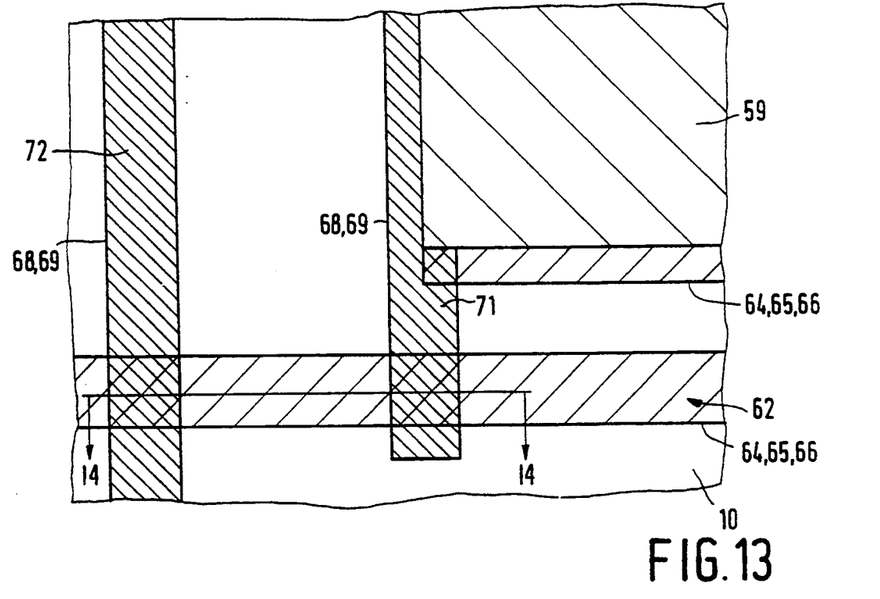
FIG. 13 is an enlarged plan view showing a part of the completed thin film structure produced by the second method.
Figure 14:
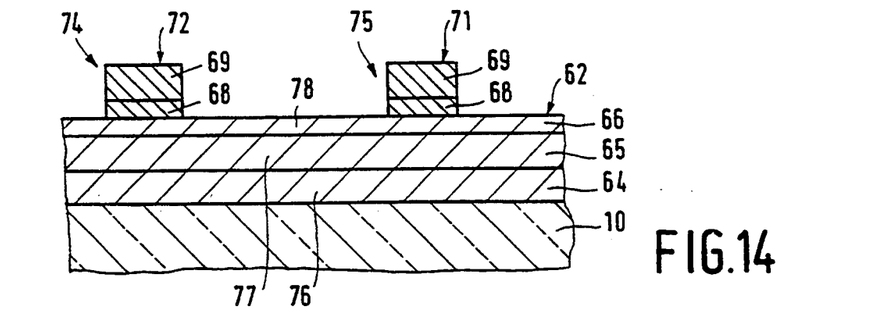
FIG. 14 is a sectional view along the line C—C of FIG. 13.

It will be understood that the strip regions 62 and 72 thus defined by the individual cell of the light shielding pattern join with corresponding strip regions defined by adjacent cells to form continuous strips constituting sets of row and column address conductors of the required active matrix array. The resulting thin film structure formed on the substrate comprises a row and column array of picture element electrodes consisting of the exposed regions of the ITO layer 59, each of which is connected to a configuration of layers constituting a TFT which in turn is connected to associated row and column address conductors. FIG. 13 shows in enlarged plan view a part of the completed thin film structure at the region of a TFT. A cross-sectional view along the line C—C of FIG. 13 is shown in FIG. 14. The row address conductor, constituted by the strip region 62, or more particularly the lower ITO layer 64, serves as a gate line for all TFTs of picture elements in the same row. This address conductor is crossed by both the strip region 72 and the extension region 71. Respective portions of these regions 72 and 71 at the cross-overs together with the immediate underlying and intervening portions of the region 62 form the TFT with the respective portions of the regions 72 and 71 serving as source and drain contacts 74 and 75, and portions of the ITO layer 64 and the SiN layer 65 respectively serving as the gate 76 and gate insulator layer 77. In operation of the TFT, a channel region 78 is formed in the a-Si:H layer 66 intermediate the source and drain regions. Upon application of a gate voltage applied to the row address conductor 62, a voltage signal present on the column address conductor 72, is transferred from the source region 74 to the drain region 75 of the TFT and then via the metal layer 69 of the extension region 71 to the ITO pad electrode 59 through the layer 68.

Figure 15:
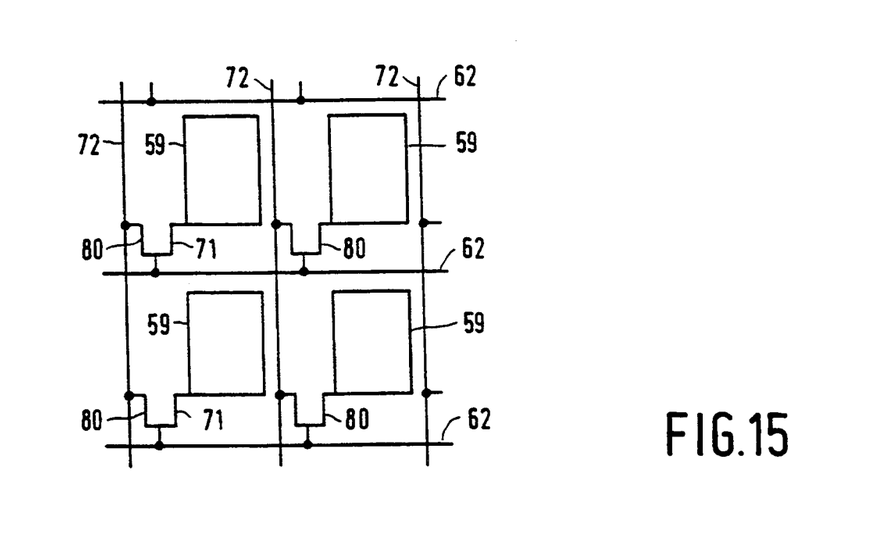
FIG. 15 illustrates the circuit configuration of a typical part of the thin film structure produced by the second method.

The circuit configuration of a typical part of the thin film structure array is illustrated in FIG. 15, in which the TFTs are referenced at 80.

In an alternative version of this embodiment, the sacrificial layer 60 may be omitted and instead use made of the resist material required in the definition of the first ITO layer 59 (and the sacrificial layer 60) to perform a similar function. In this modified method, the resist is given a special treatment, for instance by baking at a substantially higher temperature than normal, to render it resistant to the solvent, such as acetone, used to remove subsequently deposited resist layers at later stages in the method. The areas of specially treated resist unexposed to radiation and remaining after defining the ITO layer 59 are not removed but are left in situ so that the subsequently deposited layers 64, 65 and 66 overlie this area of resist, so that, in effect, the sacrificial layer 60 (FIG. 12a) is then comprised of this resist material rather than a separately deposited material. At the final lift-off stage when the sacrificial layer is to be etched away a more aggressive agent such as fumic acid is employed to remove the areas of hardened resist.

The active matrix substrate 10 is completed by covering the structure with a liquid crystal orientation layer and removing the light shielding pattern 54. This substrate is assembled together with an opposing substrate carrying a continuous electrode and a similar orientation layer with LC material disposed therebetween in conventional manner to produce the display device.

The methods of both of the above-described embodiments entail a series of photolithographic processes requiring multiple exposures. However, unlike conventional methods requiring multiple exposures using different masks, these exposures are all performed using just the one light shielding pattern, which is itself provided using just one mask. The required individual layer patterns are obtained simply by varying the angles of illumination in the photolithographic processes and using standard techniques such as temporary, sacrificial, layers and lift-off procedures. As only one light shielding pattern is used, and because this is fixed in position relative to the substrate, the kind of problems commonly experienced in conventional methods caused by registration difficulties and the need for accurate alignment in successive lithographic operations are eliminated. Moreover, since the light shielding pattern is formed on the surface of the substrate it will move with the substrate so that problems such as those caused by the effects on the substrate of thermal cycling are avoided. Significantly, this enables flexible substrate materials such as plastics to be employed as well as rigid glass substrates.

Although in the above-described examples particular materials have been mentioned for the various layers, it should be understood that other materials may be used as will be apparent to skilled persons. Thus, for example, in the first embodiment insulating materials other than silicon nitride, for example, silicon oxide, silicon oxy-nitride, aluminium oxide or tantalum pentoxide, may be used for the layer 44, the thickness of this insulating layer being suitably selected according to the material used to obtain the necessary MIM action.

With regard to the described examples, it should be appreciated that in the different photolithographic processes the angle at which the illuminating radiation meets the substrate surface when performing a slanting radiation exposure can be varied. In the example techniques described with reference to FIGS. 2a and 2b and 3a and 3b, the radiation is shown as having an angle of approximately 60 degrees with respect to the substrate surface. This angle of inclination of the incident radiation is important in that together with the distance between the light shielding pattern and the layer to be defined it determines the position of an edge of the defined layer pattern in relation to the corresponding edge of the light shielding pattern. Therefore, for those layer pattern regions which are said to have dimensions less than the dimension of the corresponding region of the light shielding pattern, the extent of the dimensional differences can be dictated by appropriate choice of the angle of the incident radiation. For radiation meeting the substrate surface at more acute angles, for example 30 or 40 degrees, this difference will be greater, whilst the difference will be less for greater acute angles, for example 70 or 80 degrees. The angle of inclination need not be the same for each exposure operation but can be changed for individual definition processes. However, a constant angle of illumination can lead to simplification of the necessary exposure equipment.

While the invention has been described with reference particularly to the fabrication of active matrix arrays for liquid crystal display devices, it should be understood that the invention is applicable also to fabricating thin film structures for other applications. For example, the invention can be used to produce active matrix arrays similar to those described for use in touch sensing devices, memory devices and image sensing devices. The invention may be used generally in the fabrication of thin film structures on transparent substrates for other purposes and is not limited to fabricating structures comprising arrays of elements.

From reading the present disclosure, other modifications will be apparent to persons skilled in the art. Such modifications may involve other features which are already known in the art of fabricating thin film structures and active matrix display devices and which may be used instead of or in addition to features already described herein.

I claim:

1. A method of fabricating on one surface of a transparent substrate a thin film structure comprising a plurality of thin film layers in predetermined patterns, which method comprises the steps of providing a light shielding pattern adjacent the opposing surface of the substrate and photolithographically patterning a first thin film layer deposited over the one surface according to the light shielding pattern using radiation directed into the light shielding pattern in a first direction, and photolithographically patterning a second thin film layer deposited over the one surface of the substrate using radiation directed onto the light shielding pattern in a second direction with respect to the substrate different from said first direction used for patterning said first thin film layer.

2. A method according to claim 1, characterized in that a third thin film layer is deposited over the one surface of the substrate and is patterned photolithographically using radiation directed onto the light shielding pattern in a direction different from that used in the patterning of one of said first and second thin film layers.

3. A method according to claim 2, characterized in that the direction of radiation used in the patterning of the third thin film layer is different from that used in the patterning of both the first and the second thin film layers.

4. A method according to claim 1, characterized in that at least one further thin film layer is deposited successively with one of said first, second and third thin film layers and is photolithographically patterned simultaneously with that layer.

5. A method according to claim 1, characterized in that at least one of said deposited thin film layers is patterned using radiation which is directed onto the light shielding pattern from more than one direction.

6. A method according to claim 5, characterized in that said one thin film layer is patterned using radiation in two substantially opposing directions which lie in a plane substantially perpendicular to the one surface of the substrate.

7. A method according to claim 1, characterized in that a temporary thin film layer pattern is provided over the one surface of the substrate by depositing a thin film layer and patterning the layer photolithographically using radiation directed onto the light shielding pattern and in that the temporary thin film layer pattern is removed following the deposition of one of said thin film layers so as to lift off immediately overlying regions of that one thin film layer.

8. A method according to claim 1, characterized in that the light shielding pattern is carried on the opposing surface of the substrate.

9. A method according to claim 8, characterized in that the light shielding pattern comprises a thin film pattern formed on the opposing surface of the substrate.

10. A method according to claim 9, characterized in that the light shielding pattern comprises metal.

11. A method according to claim 9, characterized in that the substrate comprises pliable material.

12. A method according to any one of claim 8, characterized in that following the photolithographic patterning of the deposited thin film layers, the light shielding pattern is removed from the opposing surface of the substrate.

13. A method according to claim 1, characterized in that the materials of the deposited thin film layers, the radiation directions used in the photolithographic patterning of the deposited layers, and the light shielding pattern are selected so as to form a thin film structure comprising an array of individual electrodes arranged in rows and columns, a set of parallel conductors extending between adjacent rows of electrodes and a two terminal non-linear device connecting each electrode to an associated conductor.

14. A method according to claim 13, characterized in that the light shielding pattern comprises areas of radiation opaque material arranged in rows and columns, a set of parallel strips of radiation opaque material extending between adjacent rows of said areas and bridging portions of radiation opaque material between each said area and an associated one of set of strips.

15. A method according to any one of claims 1 to 12, characterized in that the materials of the deposited thin film layers, the radiation directions used in the photolithographic patterning of the deposited layers, and the light shielding pattern are selected so as to form a thin film structure comprising an array of individual electrodes arranged in rows and columns, first and second sets of parallel conductors extending between respectively adjacent rows and adjacent columns of electrodes, and a thin film transistor between each electrode and an associated conductor of each set.

16. A method according to claim 15, characterized in that the light shielding pattern comprises areas of radiation opaque material arranged in rows and columns, first and second sets of parallel strips of radiation opaque material which cross one another and extend between adjacent rows and columns of said areas, and portions of radiation opaque material which extend between each said area and an associated one of the first set of strips.

* * * * *